United States Patent [19]

Takeuchi et al.

[11] 4,292,397
[45] Sep. 29, 1981

[54] METHOD FOR PREPARING DRY PLANOGRAPHIC PLATES WITH PLASMA

[75] Inventors: Satoshi Takeuchi, Kawasaki; Masanori Akada, Tokyo; Hitoshi Fujii, Kasukabe; Takashi Toida, Chiba; Minoru Takamizawa; Yoshio Inoue, both of Annaka, all of Japan

[73] Assignees: Dai Nippon Printing Co., Ltd.; Shin-Etsu Chemical Co., Ltd., both of Tokyo, Japan

[21] Appl. No.: 141,187

[22] Filed: Apr. 17, 1980

[51] Int. Cl.³ .............................................. G03F 7/02
[52] U.S. Cl. .................................... 430/303; 156/643; 101/456; 101/457; 101/462; 101/466; 204/165; 204/168; 427/40; 430/309; 430/329; 430/331
[58] Field of Search ............... 430/303, 309, 331, 329; 156/643; 427/34, 40, 41, 43.1, 44; 101/456, 457, 462, 466; 204/165, 168

[56] References Cited

U.S. PATENT DOCUMENTS

| | | | |
|---|---|---|---|
| 3,387,991 | 6/1968 | Erchak | 427/40 |
| 3,632,386 | 1/1972 | Hurst | 427/40 X |
| 4,036,136 | 7/1977 | Takagi | 427/40 X |
| 4,072,769 | 2/1978 | Lidel | 427/40 X |
| 4,137,365 | 1/1979 | Fletcher | 427/40 X |
| 4,225,663 | 9/1980 | Ball | 430/303 |

Primary Examiner—Edward C. Kimlin
Attorney, Agent, or Firm—Toren, McGeady and Stanger

[57] ABSTRACT

The invention provides a novel planographic printing plate suitable for dry planographic printing without supply of dampening water and a method for the preparation thereof. The inventive printing plate has, on one surface of a base plate, a layer of an organopolysiloxane composed of the areas where fresh surface of the organopolysiloxane is exposed bare as the ink-repellent non-image areas and the areas where the surface of the organopolysiloxane layer has been subjected to the treatment with low temperature plasma to be oleophilic or ink-receptive as the image areas of the printing plate. According to the inventive method, the pattern-wise exposure of the organopolysiloxane layer to the plasma atmosphere is performed by first providing a pattern-wise layer of a plasma resistant protective resist layer on the organopolysiloxane layer followed by the plasma treatment and removal of the resist layer. In an improved embodiment of the invention, a layer of an abrasion-resistant ink-receptive material is provided on the organopolysiloxane layer in the plasma-treated areas so that the durability of the printing plate is remarkably improved. Further, incorporation of a metachromatic substance susceptible to plasma treatment, e.g. a dye subject to color change by the plasma treatment, in the organopolysiloxane or in an undercoating primer layer facilitates determination of the end point of the plasma treatment.

13 Claims, 6 Drawing Figures

METHOD FOR PREPARING DRY PLANOGRAPHIC PLATES WITH PLASMA

BACKGROUND OF THE INVENTION

The present invention relates to a printing plate for dry planography requiring no dampening water and a method for the preparation thereof or, more particularly, to a printing plate for dry planography having very excellent resolving power and printing durability and a method for the preparation thereof utilizing superior ink-repellency of an organopolysiloxane composition.

Different from letterpress printing or intaglio printing, printing plates used in planographic printing have no definitely raised and recessed areas on the plate surface and the image areas and the non-image areas are formed at about the same level of the surface as differentiated by the affinity to the printing ink, i.e. ink-receptivity and ink-repellency. The process of printing is carried out typically by the following steps.

Firstly, the non-image areas of the plate surface are made hydrophilic by a chemical or mechanical treatment while the image areas are made oleophilic, i.e. ink-receptive, by transfer or photographic printing of an oil-affinitive resin. Secondly, the plate surface is wetted with dampening water which spread only over the hydrophilic areas of the non-image areas. Next, a printing ink is transferred to the thus wetted plate so as that the ink is accepted only by the oleophilic image areas without adhering to the non-image areas covered by the layer of the dampening water. Finally, printing is performed in a printing press with this printing plate so that the printing ink is transferred to a sheet of paper or the like material.

The above described planographic printing with dampening water is very defective because the transfer of the dampening water to the inking roller brings about emulsification of the printing ink on the roller resulting in scumming and the transfer of the dampening water to the paper or the like printed material causes dimensional instability of the printed material so that the printed images are not sufficiently sharp especially in the case of multi-color printing. Further, in the planographic printing with dampening water, it is of essential importance to keep a delicate balance of the amounts between the printing ink and the dampening water in order to obtain printed materials of uniform color tone while an extreme difficulty is sometimes encountered in keeping such a balance so that non-uniformity in the color tone of the printed materials is unavoidable.

Accordingly, there have been made various attempts to develop a novel planographic printing plate or a planographic printing method without the necessity of dampening water to be free from the above described disadvantages in the prior art planographic printing process. Unfortunately, none of the dry planographic printing plates developed thus far possesses properties sufficient for practical use.

For example, following methods are proposed by utilizing ink-repellency of organopolysiloxanes. First, a base plate such as an aluminum plate is provided with successive layers of a diazo photosensitive layer formed of a diazo photosensitive composition and a layer of a dimethylpolysiloxane gum and image-wise exposure to light is carried out through a positive transparency overlaid thereupon to insolubilize the diazo photosensitive layer on the exposed areas followed by removal of the diazo photosensitive composition on the unexposed areas by development treatment and peeling off of the layer of the dimethylpolysiloxane gum on the unexposed areas (see Japanese Patent Publication No. 44-23042).

In the second of the proposed methods, a base plate such as an aluminum plate is provided with successive layers of a diazo photosensitive layer, a layer of an adhesive agent and a layer of a silicone rubber and image-wise exposure to light is carried out through a negative transparency overlaid thereupon followed by development treatment utilizing the photodecomposition of the photosensitive layer on the exposed areas and peeling off of the layer of the silicone rubber (see Japanese Patent Publication No. 46-16044).

These methods have several problems or defects of their own. Due to the intervention of a layer of the non-photosensitive silicone gum or rubber between the diazo photosensitive layer and the positive or negative transparency, the fidelity in the reproduction of the image pattern borne on the positive or negative transparency is not always so high as desired on the printing plate. Further, peeling off or removal of the silicone gum or rubber layer is carried out relying on the solubility change of the photosensitive layer in the solvent so that a very serious problem is unavoidable that the images formed by the layer of the silicone rubber after peeling are never sharp and clean in the edge lines giving more or less blurred printed materials. Lastly, the process of plate making in these methods requires complicated steps of providing two or three layers on a base plate followed by exposure to light and development treatment.

As a remedy for the defective development treatment in the above described prior art methods, there have been proposed a method in which the organopolysiloxane layer is decomposed by electron beams, laser beams or electric discharge (see Japanese Patent Publication No. 42-21879) and a method in which the organopolysiloxane layer is imparted with oleophilic property by scanning with a glow or corona beam (see Japanese Patent Publication No. 48-8207). In these methods, planographic printing without the use of dampening water can be undertaken necessitating no particular development treatment by the principle of decomposition of the organopolysiloxane layer with electron beams, laser beams or electric discharge or the treatment of the organopolysiloxane layer with corona beams. A problem in these methods is the necessity of a large apparatus for the plate making process since the decomposition of the ink-repellent organopolysiloxane layer requires a very high energy to produce ink-receptive low molecular weight organopolysiloxanes. Furthermore, patterning of the organopolysiloxane layer with supply of such high energy necessarily leads to the thermal destruction of the organopolysiloxane layer so that the edge lines of the image areas are sometimes raised or bulged up resulting in the loss of sharpness of the edge lines of the images with consequent reduction of the resolving power in and the quality of the printed materials. In addition, the scanning method with a corona beam takes a long time for plate making to form the images with a special elaborate apparatus.

SUMMARY OF THE INVENTION

It is therefore an object of the present invention to provide a novel and improved method for the preparation of a printing plate for dry planographic printing utilizing the ink-repellent property of an organopolysiloxane but free from the above described problems or drawbacks in the prior art dry planographic printing plates.

Another object of the present invention is to provide a dry planographic printing plate with excellent performance in printing despite the very simple plate making process free from the defects of the prior art printing plates.

Thus, the dry planographic printing plate of the invention comprises a layer of an organopolysiloxane provided on one surface of a base plate in which the ink-repellent areas corresponding to the non-image areas are formed with the organopolysiloxane layer as such while the ink-receptive areas corresponding to the image areas are formed with the organopolysiloxane layer having been treated with low temperature plasma or having been subjected to the chemical treatment with the chemical species activated in a plasma state.

The above described dry planographic printing plate of the invention is prepared by the method which comprises the steps of (a) providing a layer of an organopolysiloxane on one surface of a base plate, (b) providing a pattern-wise protective resist layer on the surface of the organopolysiloxane layer, (c) subjecting at least the superficial layer of the organopolysiloxane in the areas where no protective resist layer is provided thereon to a chemical treatment with chemical species activated in a plasma state, and (d) removing the protective resist layer.

The inventive dry planographic printing plate and the inventive method for the plate making utilize the principle that the surface of an organopolysiloxane layer is rendered ink-receptive by the plasma treatment while the untreated surface of the same organopolysiloxane layer remains ink-repellent to differentiate the non-image areas and the image areas.

In a further improved printing plate according to the invention, the plasma-treated areas of the organopolysiloxane layer are further provided with an overcoating layer of an ink-receptive resinous material so that differentiation in the ink-receptivity or ink-repellency between the non-image areas and the image areas is further increased with very much improved durability of the printing plate.

BRIEF DESCRIPTION OF THE DRAWING

The FIGS. 1-6 are a schematic cross sectional illustration of the plate making process according to the method of the present invention as well as the schematic cross sectional views of the planographic printing plates prepared by the inventive method.

DETAILED DESCRIPTION OF THE PREFERRED EMBODIMENTS

Figure 1:

The above described present invention, which relates to a novel dry planographic printing plate and a method for the preparation thereof, has been completed as a result of extensive investigations by the inventors and based on the discovery that an ink-repellent organopolysiloxane is converted ink-receptive by the chemical treatment with low temperature plasma or with chemical species activated in a plasma state, that, different from conventional corona discharge treatment or flame treatment, this change of the nature of the organopolysiloxane by the plasma treatment takes place not only in the superficial layer but also in the subsurface layer or the body of the organopolysiloxane layer, that the change by the plasma treatment can be prevented or the organopolysiloxane layer can be protected against low temperature plasma when the organopolysiloxane layer is provided with an overlying protective resist layer, that the plasma treatment can be carried out within a short time with relatively low energy and that the effect produced by the plasma treatment has a high resolving power.

Following are several of the advantages obtained in the inventive dry planographic printing plate and the method for the preparation thereof.

(1) The organopolysiloxane is not under requirement for pattern formation, e.g. photosensitivity, so that the material can be selected from wide range of materials taking into consideration important properties such as anti-solvent resistance, abrasion resistance, adhesive bonding to the base plate and the like disregarding photosensitivity or other pattern-forming properties.

(2) The plasma treatment proceeds by the reaction between a gaseous phase and a solid phase so that the protective resist layer is under very little physical force. Therefore, the adhesive bonding strength of the protective resist layer to the organopolysiloxane layer is of minor importance. Printing plates with a high resolving power can readily be obtained since the resolving power is dependent only on the resolving power of the protective resist layer without influences by the patterning.

(3) Owing to the high gas permeability of the organopolysiloxane layer, the effect of the plasma treatment extends to the depth of the organopolysiloxane layer so that excellent durability of the printing plate in printing is obtained.

(4) The chemical species activated in a plasma state can be transported from the plasma-generating chamber to the other chambers where the plasma treatment is effected. Therefore, two or more of treatment chambers are connected to a single plasma-generating chamber and a plurability of printing plates are simultaneously processed contributing to the increased production efficiency and decreased costs for the facilities.

(5) The surface of the inventive printing plate can be perfectly flat without any smallest level difference between the image areas and the non-image areas. Accordingly, transfer of the printing ink to the blanket is improved with higher qualities of the printed materials in comparison with the conventional deep-etch plates obtained by the partial removal of the organopolysiloxane layer.

(6) Both of negative printing plates and positive printing plates can be prepared with the same principle by appropriately using the protective resist.

In the following, the inventive printing plate and the method for the preparation thereof are described in detail with reference to the drawing annexed.

Figure 4:
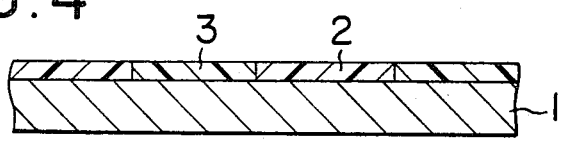

FIG. 4 is an enlarged cross section of part of the inventive printing plate. As is schematically illustrated in this figure, the printing plate is composed of a base plate 1 and a layer of an organopolysiloxane provided on one surface of the base plate 1, of which the organopolysiloxane layer is divided into the areas 2 having fresh and ink-repellent surface serving as the non-image areas and the areas 3 having plasma-treated and ink-receptive surface serving as the image areas.

Figure 2:
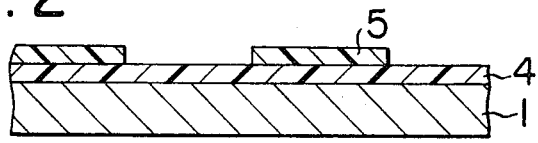
Figure 3:
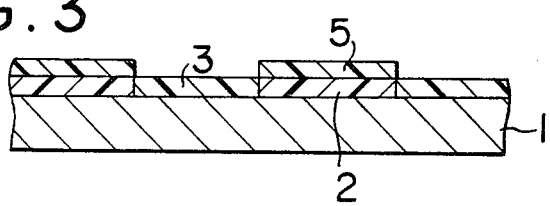

The inventive printing plate illustrated in FIG. 4 is prepared according to the steps shown by FIG. 1 to FIG. 4. Thus, the base plate 1 is provided with a uniform cured layer 4 of an organopolysiloxane having a thickness of about 2 to 50 μm as is shown in FIG. 1. The second step is the formation of the pattern-wise protective resist layer 5 on the organopolysiloxane layer 4 as is shown in FIG. 2. Then, the plate is exposed to an atmosphere of low temperature plasma filled with chemical species activated in a plasma state as is shown in FIG. 3 whereby the organopolysiloxane layer in the areas not covered by the protective resist layer 5 is chemically modified to be imparted with ink-receptivity into the image areas 3 whereas the organopolysiloxane layer covered by the protective resist layer 5 remains unchanged maintaining its ink-repellency to serve as the non-image areas 2. After completion of the plasma treatment, the protective resist layer 5 is removed finally as is shown in FIG. 4 so as to expose the fresh surface of the organopolysiloxane layer 2 in the areas not subjected to the plasma treatment.

It is desirable that the material of the base plate 1 is resistant to oxidation or etching by the plasma treatment or insensitive to the influence of photodegradation caused by the ultraviolet light produced with the plasma. Several of the examples of suitable base plate materials include copper plate, aluminum plate, stainless steel plate, zinc plate and iron plate as well as metal-plated metal plates such as nickel-plated copper or iron plate and chromium-plated iron plate and sheets or plates of organic materials such as paper, plastics and laminates thereof with foils of the above named metals.

The organopolysiloxane to be applied on to the surface of the base plate 1 has desirably good mechanical strengths and abrasion resistance so as to exhibit excellent durability in printing use. The organopolysiloxane also desirably has a strong ink repellency. In this regard, various kinds of thermosetting or heat curable organopolysiloxanes mainly composed of methylsiloxane units are suitable for the purpose. Heat curable organopolysiloxanes can be classified into several types according to the curing mechanisms but any types of the organopolysiloxanes are used in this invention without particular limitation. For example, the crosslinking reaction takes place between various kinds of functional groups such as silanol groups, silicon-bonded alkoxy groups, silicon-bonded hydrogen atoms, silicon-bonded vinyl groups and the like with the aid of a curing accelerator or catalyst by the mechanical of dehydration condensation, dealcoholation condensation, dehydrogenation condensation, addition reaction and the like. Several of the crosslinking mechanisms involve the influence of the atmospheric moisture pertaining to the condensation reaction. The organopolysiloxane is, if necessary, diluted with a suitable organic solvent and applied on to the surface of the base plate 1 by whirler coating, dipping method, flow coating or other suitable coating method followed by drying and curing with heat.

Preferred organopolysiloxane materials for forming the layer 4 on the base plate 1 are those in which at least 90% by moles of the organic groups are methyl groups in consideration of the excellent ink-repellency and capable of giving rubber-like elastic body with ink-repellency when cured with or without heating after application to the base plate 1. For example, the organopolysiloxane material suitable for the purpose is exemplified by:

(1) a diorganopolysiloxane of high degree of polymerization terminated at both chain ends with silanolic hydroxy groups in which at least 90% by moles of the organic groups are methyl groups combined with a crosslinking agent such as a methylhydrogenpolysiloxane or ethyl polysilicate and a condensation catalyst such as a metal salt of an organic acid;

(2) a diorganopolysiloxane of high polymerization degree containing silicon-bonded vinyl groups, in which at least 90% by moles of the organic groups other than vinyl groups are methyl groups, combined with a methylhydrogenpolysiloxane as the crosslinking agent and a platinum catalyst for accelerating the addition reaction; and (3) a diorganopolysiloxane of high polymerization degree terminated at both chain ends with silanolic hydroxy groups, in which at least 90% by moles of the organic groups are methyl groups, combined with an organosilane compound or a low molecular weight organopolysiloxane compound having, in a molecule, at least three hydrolyzable groups such as acetoxy, amino, oxime and isopropenoxy groups. Among the above three, the second type is particularly preferred.

In the above described organopolysiloxanes, the organic groups other than methyl groups are exemplified by alkyl groups such as ethyl and propyl groups, aryl groups such as phenyl group, alkenyl groups such as vinyl group and halogenated alkyl groups such as trifluoropropyl group.

It is optional that the above described organopolysiloxane compositions are admixed with a non-functional diorganopolysiloxane, e.g. dimethylpolysiloxane, in a limited amount not to adversely affect the properties of the cured layer thereof when further improvement is desired in the ink-repellency or a small amount of a reinforcing filler such as finely divided, silica fillers, aluminum oxide, titanium dioxide, zinc oxide and the like with an object to improve the durability of the printing plate.

It is recommendable that the surface of the base plate is cleaned by a suitable method prior to coating with the organopolysiloxane composition to obtain a uniform coating layer. Further, it is sometimes advantageous to roughen the surface of the base plate to increase the adhesive bonding strength of the organopolysiloxane layer to the base plate. It is also advisable that the surface of the base plate is coated in advance with a primer to obtain improved adhesive bonding of the organopolysiloxane layer. The primer suitable for such a use is exemplified by certain kinds of functional organosilane compounds such as vinyl tris(2-methoxyethoxy)silane, 3-glycidoxypropyl trimethoxysilane, 3-methacryloxypropyl trimethoxysilane, N-(3-trimethoxysilylpropyl) ethylenediamine, 3-aminopropyl triethoxysilane and the like, mixtures thereof, and partial hydrolysis products of one or more of these functional organosilanes.

The thus formed organopolysiloxane layer on the base plate is then overlaid with a pattern-wise protective resist layer which serves as a masking in the plasma treating. This protective resist layer is formed desirably with a material resistant against various types of radical reactions and photodecomposition reactions caused by the plasma treatment and having a moderate adhesive bonding strength to the surface of the organopolysiloxane layer. Numbers of materials satisfy the above requirements when applied with a thickness of several micrometers or larger since the time of the plasma treatment usually lasts several minutes at longest. Suitable materials are, for example, commercially available photoresists, photosensitive resins and other photosensitive materials with good applicability for coating. Most of commercially available materials can be used for patterning by a conventional photoresist plate making method.

Formation of the pattern-wise photoresist layer is effected by directly applying the photoresist solution on to the surface of the organopolysiloxane layer. Alternatively, a transfer method is applicable in this case according to which a plastic film such as a polyethylene or polypropylene film is coated with the photoresist solution and, after drying, the film is contacted with pressure and heat on to the organopolysiloxane layer so that the photoresist material is transferred to the organopolysiloxane layer to be followed by patterning. In the direct application of the photoresist solution to the organopolysiloxane layer, there may be a case where the organopolysiloxane layer is repellent to the photoresist solution and the latter cannot spread evenly on the surface of the former. This difficulty is mitigated by the addition of a suitable surface active agent to the photoresist solution to decrease the viscosity of the solution.

Many of the commercially available photoresist materials are not always satisfactory in this regard of affinity with the organopolysiloxane. Photosensitive organopolysiloxanes various types of photosensitive groups bonded to the silicon atoms are quite satisfactory in respect of the affinity with the underlying organopolysiloxane layer and easily applicable thereto. The film thickness of such a photosensitive organopolysiloxane layer is in the range of 2 to 5 $\mu$m in order to give a sufficient protection to the underlying organopolysiloxane layer by the plasma treatment. The photosensitive organopolysiloxane for forming the protective resist layer is required to have good wettability on the surface of the underlying organopolysiloxane layer. This requirement is satisfied when the photosensitive organopolysiloxane has a surface tension approximately equal to that of the underlying organopolysiloxane. Most of known photosensitive organopolysiloxanes, having a surface tension of from 18 to 25 dynes/cm or, preferably, from 20 to 23 dynes/cm at 20° C. are suitable for the purpose.

The applicability-improving effect obtained by the use of an organopolysiloxane is also exhibited when the organopolysiloxane is admixed with a conventional commercially available photoresist material in an amount from 1 to 15% by weight. These organopolysiloxanes suitable for the blending purpose include photosensitive ones and non-photosensitive ones, which latter class of the organopolysiloxanes being exemplified by silicone gums commercially available by the tradenames of, for example, KS 774 and KS 705F supplied by Shin-Etsu Chemical Co., Japan, and silicone varnishes commercially available by the tradename of, for example, KR 271 supplied by the same company.

Examples of the photosensitive organopolysiloxanes include an organopolysiloxane containing organosiloxane units having substituted or unsubstituted maleimido groups (see Japanese Patent Disclosure Nos. 51-120804, 51-125277, 52-13907, 52-105002 and 52-116304), an organopolysiloxane containing organosiloxane units having substituted or unsubstituted acryloxy groups (see Japanese Patent Disclosure Nos. 48-16991, 48-19682, 48-21779, 48-21779, 48-23880, 48-47977, 48-48000, 48-83722, 51-34291, 51-52001, 52-105003, 52-105004, 52-113805 and 52-113801), a mixture of an organopolysiloxane containing organosiloxane units having mercapto groups and an organopolysiloxane containing organosiloxane units having vinyl groups (see Japanese Patent Disclosure No. 53-17405), a mixture of an organopolysiloxane containing organosiloxane units having vinyl groups and an organohydrogenpolysiloxane (see Japanese Patent Disclosure No. 53-15907), an organopolysiloxane containing organosiloxane units having amido groups (see Japanese Patent Disclosure Nos. 52-139200 and 52-139504) and a mixture of an organopolysiloxane containing organosiloxane units having acryloxy groups and an organopolysiloxane containing organosiloxane units having vinyl groups (see Japanese Patent Disclosure No. 52-139505).

When the protective resist layer is formed with a mixture of an organic photosensitive material and an organopolysiloxane, the organic photosensitive material is selected from azido compounds, p-quinone diazido compounds, cinnamic acid derivatives and acrylic acid and esters thereof (see Japanese Patent Disclosures Nos. 49-68803, 49-86102, 49-121601 and 51-134204).

Pattern-wise formation of the protective resist layer on the surface of the organopolysiloxane is carried out by screen printing with an ink containing ethylcellulose, hydroxyethylcellulose or an acrylic resin. In this case, both of direct printing and transfer methods are applicable. The transfer method is preferable because the addition of a viscosity-decreasing agent is detrimental to the printability. The resist layer is also formed by the electrophotographic process using a tonor for electrophotography as the resist material. Good electrostatic latent images and tonor images are formed since the organopolysiloxane is a good insulating material. Most simply, hand-written images with a suitable film-forming resin solution can be used either directly or by transfer method.

The next step is the plasma treatment of the plate provided with the layer of the organopolysiloxane and pattern-wise protective resist layer so as that the organopolysiloxane layer on the unprotected areas is exposed to the plasma atmosphere to become oleophilic or ink-receptive. Suitable plasma gas is exemplified by inert gases such as argon, helium and neon and active gases such as oxygen and air.

It is generally accepted that the effect of the plasma treatment is a combination of (1) etching, (2) chemical modification, (3) crosslink formation and (4) polymerization in a very much complicated manner. In this case of the plasma treatment of the organopolysiloxane layer, the electronmicroscopic observation and infrared absorption spectroscopy indicated that no etching of the organopolysiloxane layer took place but chemical modification of the organopolysiloxane by the abstraction of alkyl groups and formation of hydroxy and carbonyl groups occurred. It is presumable that the ink-receptivity of the plasma-treated organopolysiloxane surface is obtained by the abstraction of the alkyl groups, formation of silicon free radicals, network formation of the organopolysiloxane by crosslinking and formation of hydroxy and carbonyl groups by the oxidation of the alkyl groups caused by the impingement of the chemical species activated in a plasma state.

The above described effect of plasma treatment is obtained not only in the superficial layer of the organopolysiloxane but also in the depth of the organopolysiloxane layer as the time of plasma treatment is extended.

This is presumably because the organopolysiloxanes have a high permeability to various kinds of gases so that the chemical species activated in a plasma state can reach the depth of the organopolysiloxane layer penetrating therethrough. This is a very unique advantage of the plasma treatment in comparison with corona discharge treatment or flame treatment where the effect is limited to the surface of the layer and is readily lost by mere rubbing. On the contrary, the effect of plasma treatment in the invention is very durable and never lost by rubbing so that excellent durability of the printing plate is obtained in accordance with the present invention.

As the gas for forming the plasma atmosphere are used inert gases such as argon, neon and helium and active gases such as oxygen, nitrogen, ammonia, carbon dioxde and fluorocarbons but, in most cases, air is satisfactory. The duration of plasma treatment is determined depending on various conditions but, for example, a treatment of 30 seconds or more is sufficient in an atmosphere of $3 \times 10^{-2}$ Torr of air with a power supply of 300 watts to give satisfactory ink-receptivity to the surface of the organopolysiloxane layer. A treatment of 20 minutes or longer is undesirable under the same conditions as above since etching may take place in the protective resist layer.

When a high resolving power is desired in the pattern-wise plasma treatment, the thickness of the protective resist layer should be as small as possible. However, this is only possible by the sacrifice of the protecting power. It is generally unavoidable that the organic protective resist layer is susceptible to the attack of the plasma to be dissipated and lost with decreasing thickness of the protective resist layer. This difficulty can be reduced when a suitable plasma-resistant material is incorporated into the protective resist layer so as that the thickness of the protective layer can be decreased contributing to a high resolving power without loss of protecting power. Various kinds of organic and inorganic, in particular inorganic, fillers are used as a plasma-resistant material. When subjected to the attack by the oxygen plasma, inorganic fillers remain in the protective resist layer in the form of an oxide even if the filler per se is not an oxide. Metal oxide fillers such as zinc oxide, titanium dioxide, copper oxide, iron oxide and the like are quite stable against the attack of oxygen plasma.

As a characteristic of the attack by plasma, the attack is directed perpendicularly to the attacked surface. Therefore, any body merely placed on the surface has a protecting effect against the plasma attack. By this reason, the amount of the filler in the protective resist layer can be very small. Several of the fillers suitable as a plasma-resistant material are oxides and hydroxides such as silica, titanium dioxide, zinc oxide, lead oxide, aluminum oxide and aluminum hydroxide as well as metal powders such as iron, zinc tin, nickel, copper, germanium, aluminum and the like, metal sulfides, and metal-containing double salts and complexes. The amount of these plasma-resistant fillers in the protecting layer is preferably in the range from 10 to 70% by weight.

When the surface of the organopolysiloxane layer has been subjected to pattern-wise attack of plasma sufficiently, the surface in the plasma-treated areas becomes somewhat matted and whitish in comparison with the fresh surface although not so clearly visible. It is therefore advantageous to incorporate into the organopolysiloxane layer a metachromatic substance, i.e. a substance susceptible to color formation, color change or color fading by the plasma treatment, so as that the extent of the effect of plasma treatment can be readily examined visually. For example, a dyestuff liable to fading by oxidation such as certain kinds of soluble basic dyes is used in the plasma treatment in air or oxygen with which the extent of the plasma treatment is readily determined by the degree of fading by visual examination. Suitable dyes for such a purpose include conventional dispersed dyes and cationic dyes as exemplified by Kayaset Blue FR (product by Nippon Kayaku Co.), TB Violet 501 (product by Sumitomo Chemical Co.), crystal violet, methylene blue and the like. These dyestuffs are admixed with the organopolysiloxane in an amount of 0.5 to 5% by weight.

When a dye or pigment which becomes colored by oxidation is incorporated into the organopolysiloxane, the organopolysiloxane layer becomes colored only in the areas subjected to the plasma treatment. For example, coloring is obtained in the plasma-treated areas without the protective resist layer when a leuco dye is used. Examples of such a dye is a leuco dye in which a lactone ring is formed such as leuco methylene blue and a dye decolorized by reduction such as vat dyes.

As is mentioned above, the organopolysiloxane layer has a good permeability to gases so that the chemical species activated in a plasma state readily penetrate to the depth of the organopolysiloxane layer. In this connection, it is recommendable that, instead of admixing the metachromatic material in the body of the organopolysiloxane layer, the material is used only in the anchoring layer or the primer layer as the undercoating of the organopolysiloxane so that the color appearance or discoloration takes place only after completion of the plasma treatment of whole thickness of the organopolysiloxane layer to give a great convenience for determining the end point of the plasma treatment.

The last step of the inventive method is the removal of the pattern-wise protective resist layer from the surface of the organopolysiloxane layer. Use of a strong acid or alkali is undesirable for removing the resist layer since such a strong chemical may be detrimental also for the organopolysiloxane. In this respect, dissolving away by use of an organic solvent is preferred such as acetone, ethyleneglycol monoethyl ether, toluene and the like. Particularly suitable remover solvents for the respective photoresist material are recommended by the producers of the photoresist material. The resist layer formed by screen printing is removed with toluene and the like and the tonor resist formed by electrophotography is removed with a polar organic solvent such as methylethylketone. In some cases, the resist layer can be removed by use of an adhesive tape which is pressed to the surface of the resist layer and then peeled off to bring apart the resist layer off the organopolysiloxane layer since the adhesive bonding between the organopolysiloxane layer and the resist layer is relatively weak.

Figure 5:
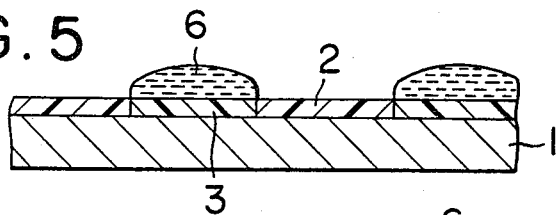

The planographic printing plate prepared as described above has a cross sectional structure as shown in FIG. 4. The surface of the organopolysiloxane layer in the non-image areas 2 is very rich in peelability and exhibits extremely low adhesion with the printing ink so that, when the printing ink is supplied from the inking roller as is shown in FIG. 5, the printing ink is never transferred to the non-image areas 2 but adheres only to the image areas 3 having been subjected to the plasma treatment to give the ink layer 6 since the adhesive strength between the printing ink and the non-image areas 2, i.e. fresh surface portion of the organopolysiloxane layer, is definitely smaller than between the printing ink and the inking roller or than the cohesion in the printing ink per se. Thus, a dry planographic printing plate necessitating no dampening water is obtained.

In the preparation of the inventive dry planographic printing plate, the organopolysiloxane is used as selected from a wide variety of organopolysiloxanes capable of giving practically sufficient durability in printing. In this connection, silicone rubbers are suitable in most cases with lowest ink-receptivity and with sufficient surface strength to endure practical printing of a long run. On the other hand, the layer of the silicone rubber in the plasma-treated areas are chemically denaturated so that the mechanical strength of the organopolysiloxane layer in the image areas is somewhat decreased unavoidably. According to the inventors' experience, the organopolysiloxane layer in the image areas is somewhat worn out after printing of up to 100,000 sheets. In other words, the perfectly flat printing plate before use becomes something like a deep-etch plate after many times of repeated printing.

Figure 6:
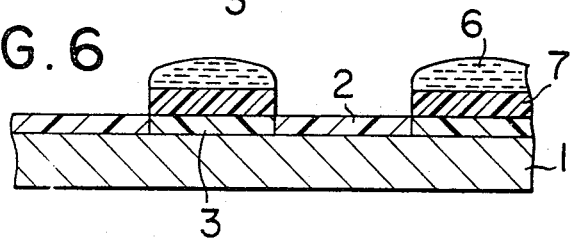

The inventors have conducted investigations to obtain further extended life of the inventive printing plate and arrived at a following discovery. Thus, the greatly improved affinity of the plasma-treated organopolysiloxane layer to various kinds of chemical substances both hydrophilic and oleophilic permits adhesive bonding of a different kind of resinous materials exhibiting larger abrasion resistance along with good ink-receptivity. For example, a thermosetting resins applied to the printing plate with a roller adheres only to the plasma-treated areas where the resin is cured to be firmly bonded to the surface of the plasma-treated organopolysiloxane layer providing a reinforcement layer 7 therefore as is shown in FIG. 6 to be ink-receptive image areas exhibiting higher abrasion resistance than the original organopolysiloxane layer. In this case, the surface of the overlying resin layer is raised by 0.1 to 5 $\mu$m above the surface of the organopolysiloxane layer exhibiting better printability. The printing durability of such a printing plate is determined by the abrasion resistance of the organopolysiloxane forming the nonimage areas and usually 200,000 to 300,000 sheets of good printed materials are readily obtained.

An alternative way for the preparation of a printing plate having resin-reinforced areas as the image areas of the printing plate as shown in FIG. 6 is as follows. Thus, the base plate 1 with the layer of the organopolysiloxane 4 and the pattern-wise protective resist layer 5 is subjected to the plasma treatment to have the chemically modified portions of the organopolysiloxane 3 as is shown in FIG. 3. Then, a layer of a ink-receptive and abrasion-resistant material, e.g. a thermosetting resin such as an acrylic polyol resin, is provided on the whole surface to cover both of the organopolysiloxane layer 3 and the protective resist layer 5 in a coating thickness of 0.1 to 10 $\mu$m followed by curing of the thermosetting resin. When the surface of the thermosetting resin layer is rubbed gently with a soft cloth wet with an organic solvent such as methylethylketone, the layer of the thermosetting resin on the protective resist layer 5 is readily removed together with the underlying protective resist layer 5 so as that the surface of the organopolysiloxane having not chemically modified by the plasma treatment is exposed bare to form the non-image areas 2 while the thermosetting resin on the areas 3 where the organopolysiloxane layer has been subjected to the plasma treatment cannot be removed by rubbing owing to the strong adhesive bonding with the plasma-treated organopolysiloxane layer 3 to give a printing plate as shown in FIG. 6 by the cross section.

Following are the examples to illustrate the present invention in further detail.

EXAMPLE 1

An aluminum plate degreased and cleaned was coated with an organopolysiloxane composition (KS 705F, a product by Shin-Etsu Chemical Co., Japan) in a thickness of 10 $\mu$m as dried and, after curing, overcoated with a photoresist solution (AZ 111, a product by Shiplay Co.) admixed with 1% by weight of a surface active agent (FC 431, a product by MMM Co.) followed by drying to give a coating film of 3 $\mu$m thickness. Exposure to light of the photoresist layer through a negative transparency contacted thereon with subsequent development gave a pattern-wise layer of the photoresist on the organopolysiloxane layer.

Then the plate was subjected to a treatment with plasma for 5 minutes in an atmosphere of $1 \times 10^{-2}$ Torr of air with a power supply of 300 watts whereby the organopolysiloxane layer exposed bare was rendered oleophilic or ink-receptive. The photoresist was removed by dissolving away with acetone. The thus obtained planographic printing plate was suitable for dry planographic printing without supply of dampening water to give more than 50,000 sheets of sharp printed materials exhibiting sufficient practical durability.

EXAMPLE 2

A polypropylene film coated with a photoresist (T.P.R., a product by Tokyo Ohka Kogyo Co., Japan) in a thickness of 3 $\mu$m as dried was contacted directly with an aluminum base plate having a cured coating layer of a polydimethylsiloxane (KS 774, a product by Shin-Etsu Chemical Co., Japan) with heat and pressure whereby the layer of the photoresist was transferred on to the surface of the layer of the polydimethylsiloxane. The layer of the photoresist was exposed to light patternwise through a positive transparency overlaid in direct contact therewith followed by development to give pattern-wise layer of the photoresist on the dimethylpolysiloxane layer.

Plasma treatment was carried out in an atmosphere of $3 \times 10^{-2}$ Torr of air with a power supply of 300 watts for 10 minutes and the layer of the photoresist was removed by dissolving away with ethyleneglycol monoethyl ether. The thus obtained planographic printing plate was as good as in Example 1 to give more than 50,000 sheets of satisfactory printed materials.

EXAMPLE 3

The procedure for the preparation of the plate with the photoresist layer was about the same as in Example 1 except that the organopolysiloxane was a dimethylpolysiloxane (KE 77, a product by Shin-Etsu Chemical Co., Japan). The plasma treatment was undertaken in an atmosphere of $3 \times 10^{-2}$ Torr of argon gas with a power supply of 300 watts for 10 minutes. The thus obtained planographic printing plate had a printing durability to give more than 30,000 sheets of satisfactory printed materials.

EXAMPLE 4

The procedure for the preparation of the plate with the photoresist layer was about the same as in Example 1 except that the organopolysiloxane was a polydimethylsiloxane (KS 705F, a product by Shin-Etsu Chemical Co., Japan). The plasma treatment was undertaken in an atmosphere of $1 \times 10^{-2}$ Torr of a fluorocarbon gas (Freon 22, a product by E.I. duPont de Nemours & Co.) with a power supply of 300 watts for 3 minutes. The thus obtained planographic printing plate had a printing durability to give more than 50,000 sheets of satisfactory printed materials.

EXAMPLE 5

The procedure for the preparation of the plate with the photoresist layer was just the same as in Example 1. The plasma treatment was undertaken in an atmosphere of $3 \times 10^{-2}$ Torr of ammonia gas with a power supply of 300 watts for 5 minutes. Removal of the photoresist layer after completion of the plasma treatment was carried out by use of an adhesive tape (a paper-based adhesive tape, a product by Nitto Denko Co., Japan). The thus obtained planographic printing plate had a printing durability to give more than 40,000 sheets of satisfactory printed materials.

EXAMPLE 6

An aluminum plate having a cured coating layer of a polydimethylsiloxane (KS 773, a product by Shin-Etsu Chemical Co., Japan) in a thickness of 10 μm was overcoated with a photoresist (AZ 111) admixed with 1% by weight of a surface active agent (FC 431) and dried.

Two of the thus prepared plates were subjected to exposure to light and development as in Example 1. These plates were placed separately each in a chamber for plasma treatment, into which the active chemical species in a plasma state generated in an atmosphere of $1 \times 10^{-2}$ Torr of air with a power supply of 300 watts were introduced and two plates were subjected to the plasma treatment simultaneously for 5 minutes. Both of the planographic printing plates obtained by peeling of the photoresist layer had a printing durability to give more than 50,000 sheets of satisfactory printed materials.

EXAMPLE 7

A reaction mixture was prepared by blending 247 parts (hereinafter, all parts are given by parts by weight) of a 15% toluene solution of an αω-dihydroxy dimethylpolysiloxane expressed by the formula HO(Me₂SiO)₅₀₀H, where Me is a methyl group, and 60 parts of a 15% toluene solution of a hydrolysis product of phenyltrichlorosilane with admixture of 0.25 part of 3-methacryloxypropyl trimethoxysilane, 0.01 part of dibutylhydroxytoluene and 0.1 part of dibutyltin dilaurate and the reaction mixture was heated under reflux of toluene for 8 hours to give a 15% solution of a copolymeric organopolysiloxane having a viscosity of 28.5 centistokes at 25° C.

A photopolymerizable composition was prepared by diluting 50 parts of the above prepared photopolymerizable organopolysiloxane with 950 parts of toluene and with admixture of 2.5 parts of 4-trimethylsilyl benzophenone and this solution was applied on to the cured layer of an ink-repellent silicone (KS 705F, a product by Shin-Etsu Chemical Co., Japan) of 10 μm thickness on an aluminum base plate of 0.3 mm thickness by roller coating to give a film thickness of 3 μm as dried.

A positive transparency was contacted directly with the photopolymerizable organopolysiloxane layer and pattern-wise exposure to light of the photopolymerizable organopolysiloxane layer was undertaken followed by development with trichloroethylene to give a plate having a pattern-wise photopolymerized organopolysiloxane layer on the ink-repellent silicone layer. This plate was subjected to plasma treatment in a plasma reaction chamber in an atmosphere of 0.3 Torr of air with a power supply of 300 watts for 2 minutes.

After completion of the plasma treatment, the photopolymerized pattern-wise organopolysiloxane layer was removed by gently rubbing with soft paper wetted with methylethylketone to give a planographic printing plate having the plasma-treated areas as the image areas and fresh areas as the non-image areas.

The printing test undertaken with this printing plate mounted on a K.O.R. printing press without supply of dampening water gave about 20,000 sheets of sharp and satisfactory printed materials.

EXAMPLE 8

A mixture prepared by dissolving 260 parts of dimethyl dichlorosilane and 50 parts of phenyl trichlorosilane in 1000 parts of toluene was added dropwise into 1100 parts of water kept at 25° C. or below with agitation to effect cohydrolysis and partial condensation. The hydrolysis condensation product above was washed with water, neutralized and dehydrated to give a 15% toluene solution of an organopolysiloxane. Into 1000 parts of this toluene solution were added 50 parts of 3-aminopropyl triethoxysilane and 0.2 part of dibutyltin dilaurate and a de-ethanolation reaction was carried out to give a toluene solution of a 3-aminopropyl-containing organopolysiloxane expressed by the following formula, in which Me is a methyl group and Ph is a phenyl group:

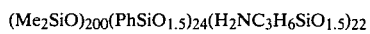

In the next place, a solution of 3.94 g of α-phenylmaleic anhydride in 10 ml of dimethylformamide was added dropwise at 20° C. to the above obtained toluene solution of the 3-aminopropyl-containing organopolysiloxane in such an amount that an equimolar ratio was obtained between the α-phenylmaleic ahydride and the 3-aminopropyl groups and the reaction was carried out at 25° C. for 1 hour and then at 110° C. for 4 hours with continuous removal of the condensation water produced by the reaction out of the reaction mixture. The resultant toluene solution contained a maleimido-containing organopolysiloxane to be expressed by the following formula as identified by infrared absorption spectroscopy, in which Q is an α-phenylmaleimido group of the formula

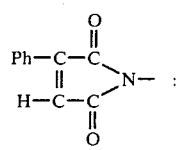

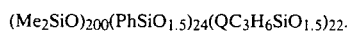

This organopolysiloxane was solid at room temperature having a softening point of 110° to 120° C.

A solution prepared by dissolving 50 parts of the above obtained photopolymerizable organopolysiloxane in 950 parts of toluene was applied by roller coating in a thickness of 3 μm as dried on a copper plate of 0.3 mm thickness provided in advance with a cured coating layer of a silicone (KS 774, a product by Shin-Etsu Chemical Co., Japan). Then, pattern-wise exposure to light and development were carried out in the same manner as in Example 7 to give a pattern-wise photocured organopolysiloxane layer on the surface of the ink-repellent organopolysiloxane layer.

Plasma treatment of the plate was carried out in an atmosphere of 0.1 Torr of oxygen with a power supply of 300 watts for 2 minutes and the pattern-wise photocured organopolysiloxane layer was removed by gently rubbing with a soft cloth wetted with toluene to give a planographic printing plate having the plasma-treated areas as the image area and the fresh areas as the non-image areas.

The printing test undertaken with this printing plate mounted on a K.O.R. printing press without supply of dampening water gave more than 30,000 sheets of sharp and satisfactory printed materials.

EXAMPLE 9

The same plate making process as in Example 7 was repeated except that the photopolymerizable organopolysiloxane composition was replaced with a solution prepared with 50 parts of a block copolymerized organopolysiloxane expressed by the formula $(CH_2=CH-C_3H_6SiO_{1.5})_4(PhSiO_{1.5})_{20}(Me_2SiO)_{400}$, 2.5 parts of tetra-3-mercaptopropyl tetramethylcyclotetrasiloxane and 1 part of 4,4'-bis(dimethylamino)benzophenone dissolved in 950 parts of toluene.

Printing test was undertaken with this printing plate directly to sheets of paper without using a blanket to give about 20,000 sheets of sharp and satisfactory printed materials.

EXAMPLE 10

A self-sensitizing photopolymerizable organopolysiloxane was prepared in the same manner as in Example 7 except that the composition was admixed with 0.14 part of 4-dimethylamino-4'-(trimethoxysilylethyl) dimethylsilylbenzophenone as a photosensitizer. A planographic printing plate was prepared in the same manner as in Example 1 using the above prepared photopolymerizable organopolysiloxane composition and printing test was undertaken with the printing plate mounted on a K.O.R printing press without supply of dampening water to give more than 30,000 sheets of sharp and satisfactory printed materials.

EXAMPLE 11

A photopolymerizable organopolysiloxane composition was prepared by dissolving 100 parts of an azido-containing organopolysiloxane expressed by the formula

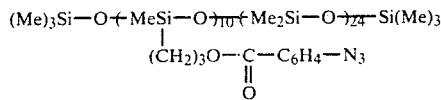

and 5 parts of 4-nitroaniline in 700 parts of acetone. A planographic printing plate was prepared in the same manner as in Example 7 and printing test was undertaken with the printing plate mounted on a K.O.R. printing press without supply of dampening water to give about 20,000 sheets of sharp and satisfactory printed materials.

EXAMPLE 12

The plate making process was the same as in Example 2 except that the organopolysiloxane layer on the aluminum plate was formed with a solution prepared by dissolving 3 parts of polycinnamoyloxyethyl methacrylate, 1 part of 2,6-di(4'-azidobenzal)cyclohexane and 7 parts of an organopolysiloxane gum having a viscosity of about 3,000,000 centistokes at 25° C. in 900 parts of a 3:1 mixture of methylethylketone and cyclohexanone. The printing test undertaken with the printing plate mounted on a K.O.R. printing press without supply of dampening water gave about 30,000 sheets of sharp and satisfactory printed materials.

EXAMPLE 13

A base plate of aluminum was provided successively with a cured layer of a polydimethylsiloxane (KS 774, a product by Shin-Etsu Chemical Co., Japan) in a thickness of 5 μm and a layer of a mixture composed of 10 parts of a polycinnamic acid-based photosensitive resin (TPR, a product by Tokyo Ohka Kogyo Co., Japan) and 1 part of the photopolymerizable organopolysiloxane obtained in Example 7 in a thickness of 4 μm followed by drying. The coating performance of the latter solution was excellent and good adhesion was obtained with the undercoating layer of the polydimethylsiloxane. The exposure to light and development were carried out according to the use direction for the TPR photosensitive resin and the plasma treatment was carried out in the same manner as in Example 7. It was found that the above given formulation was quite satisfactory for providing a layer of stable photosensitive resin.

EXAMPLE 14

The same plate making process was repeated as in Example 13 except that the formulation for the layer of the photosensitive resin was a mixture of 10 parts of the TPR resin and 0.5 part of a silicone fluid to give a printing plate having a layer of the photosensitive resin similarly stable to Example 13.

EXAMPLE 15

A silk screen plate for screen printing was prepared with a standard test pattern. Screen printing was carried out on the cured layer of a polydimethylsiloxane (KE 103RTV, a product by Shin-Etsu Chemical Co., Japan) formed on an aluminum plate in the same manner as in Example 1 with the above prepared silk screen plate and a screen printing ink composed of 20 parts of a screen oil, of which the main ingredients were ethylcellulose and pine oil, and 80 parts of glass frit. After drying, the plate was subjected to plasma treatment in an atmosphere of $3 \times 10^{-2}$ Torr of oxygen for 2 minutes with a power supply of 300 watts. Removal of the resist layer of the screen printing ink with toluene gave a planographic printing plate and the printing test undertaken with the printing plate gave more than 50,000 sheets of sharp and satisfactory printed materials.

EXAMPLE 16

A pattern-wise resist layer was formed on the layer of an organopolysiloxane expressed by the formula $$(PhSiO_{1.5})_{400}(Me_2SiO)_{20}$$

formed on an aluminum plate by transferring the tonor images formed on a zinc oxide paper. The plasma treatment of the plate was carried out in the same conditions as in Example 3 and the tonor resist was removed by spraying with methylethylketone to give a planographic printing plate. This printing plate had a good printing durability to give more than 50,000 sheets of sharp and satisfactory printed materials.

EXAMPLE 17

The formulation of the photosensitive resin solution was the same as in Example 13 but the solution was further admixed with 2% by weight of an inorganic filler of silica, titanium dioxide or aluminum oxide. The thickness of the coating layer with the photosensitive resin solution was 1 μm, 2 μm or 3 μm as dried and the pattern-wise exposure to light and development were undertaken according to the use direction for the TPR photosensitive resin. The plasma treatment was undertaken in the same manner as in Example 7.

It was found that a 1 μm thickness of the resist layer was somewhat insufficient to withstand the plasma treatment of an extent to give a sufficient effect to a polydimethylsiloxane layer of 5 μm thickness while a thickness of the resist layer of 2 μm or 3 μm was quite satisfactory. This result indicated a remarkable improvement in the plasma resistance of the resist layer since a resist layer of 3 to 4 μm was required when no inorganic filler was admixed in the resist layer. In addition to the about twice improvement of the plasma resistance of the protective resist layer as described above, the addition of an inorganic filler was also advantageous in improving the resolving power of the printing plate. Thus, 5% of the dots of a 250 lines/inch screen plate could be reproduced when the thickness of the resist layer was 2 μm in the above experiment with addition of an inorganic filler while the upper limit of solution without addition of an inorganic filler was reproduction of 5% of the dots of a 175 lines/inch screen with a thickness of the resist layer of 4 μm.

EXAMPLE 18

The experimental procedure for plate making was the same as in Example 13 except that the organopolysiloxane layer of 5 μm thickness was formed with admixture of an inorganic filler of silica, titanium dioxide or aluminum oxide in an amount of 2% by weight calculated as solid.

The addition of an inorganic filler in the organopolysiloxane layer was advantageous in improving the printing durability of the printing plate. For example, the number of the sharp and satisfactory printed materials obtained with the printing plates with admixture of silica, titanium dioxide or aluminum oxide was 100,000 sheets, 80,000 sheets or 70,000 sheets, respectively, while the number without addition of an inorganic filler was 50,000 sheets.

EXAMPLE 19

The experimental procedure for plate making was the same as in Example 13 except that the layer of the organopolysiloxane of 5 μm thickness was colored by admixing 0.01% by weight of a blue dispersed dye (Kayaset Blue FR, a product by Nippon Kayaku Co., Japan). This blue coloring of the organopolysiloxane layer was faded in the areas directly exposed to the plasma atmosphere without being provided with the protective resist layer so that discernment of the demarcation between the plasma-treated areas and the fresh areas was very easy even after removal of the resist layer.

EXAMPLE 20

The experimental procedure for plate making was the same as in Example 19 except that the blue dispersed dye was replaced with the same amount of Crystal Violet Lactone as a leuco dye. In this case, blue coloring of the organopolysiloxane layer was obtained only in the areas exposed directly to the plasma atmosphere while the organopolysiloxane layer not exposed to the plasma atmosphere in the areas protected by the resist layer remained colorless so that discernment of demarcation of the plasma-treated areas and the fresh areas was very easy.

EXAMPLE 21

The experimental procedure for plate making was the same as in Example 13 except that the aluminum base plate was treated with 3-aminopropyl triethoxysilane as a primer prior to coating with the organopolysiloxane in a thickness of 5 μm and that the primer was admixed with 0.01% by weight of Crystal Violet Lactone as a leuco dye.

In this case, blue coloring of the primer layer was obtained only in the areas where the organopolysiloxane layer was sufficiently exposed to the plasma atmosphere while no coloring was obtained, needless to say of the areas covered by the resist layer for protecting the organopolysiloxane from the plasma atmosphere, when the time of the plasma treatment was insufficiently short or in the areas where the effect of the plasma treatment was not uniform. This result is an evidence for the fact that the effect of the plasma treatment takes place not only in the surface of the organopolysiloxane layer but also throughout the layer down to the bottom surface of the layer so that incorporation of a colored or chromogenic dye in the underlying primer layer can give a good indication of the end point of the plasma treatment.

The organopolysiloxane layer having been subjected to the plasma treatment throughout down to the bottom surface exhibited no brittleness and gave a satisfactory planographic printing plate, with which 30,000 to 50,000 sheets of sharp printed materials were obtained in the printing test.

EXAMPLE 22

The procedure down to the formation of the pattern-wise protective resist layer on the organopolysiloxane coating layer was the same as in Example 13 and the plasma treatment was undertaken in the same manner as in Example 7. The thus plasma-treated surface was then coated by whirler coating with a solution prepared by dissolving 15 parts of an acrylic polyol resin (Thermolac U-245B, a product by Soken Chemical Co., Japan) and 10 parts of an isocyanate curing agent (Takenate A-3, a product by Takeda Pharmaceutical Co., Japan) in 350 parts of ethyl acetate followed by curing at 100° C.

The thus overcoated surface was then rubbed gently with a soft cloth wetted with methylethylketone. By this rubbing, the overcoating layer remained as such in the areas where the organopolysiloxane layer had been subjected to the plasma treatment without protection by the resist layer as firmly bonded to the surface of the organopolysiloxane layer while the overcoating layer was easily rubbed off in the areas where the overcoating was provided on the protective resist layer and the organopolysiloxane layer not subjected to the plasma treatment was exposed bare by this rubbing off of the overcoating layer together with the resist layer.

The thus prepared printing plate had the non-image areas formed of the fresh and bare surface of the organopolysiloxane not subjected to the plasma treatment and the image areas where the plasma-treated surface of the organopolysiloxane was coated with the overcoating of the cured resin. The surface level of the overcoating layer in the image areas was about 3 μm higher than the bare surface of the organopolysiloxane in the non-image areas so that the ink-receptivity of the printing plate was remarkably improved to give about 300,000 sheets of sharp and satisfactory printed materials in the offset printing test.

EXAMPLE 23

The experimental procedure down to the plasma treatment was the same as in Example 22. The plasma-treated surface was directly rubbed with a cloth wetted with methylethylketone to remove the protective resist layer remaining pattern-wise on the organopolysiloxane layer. Then an overcoating layer was provided by whirler coating with a solution prepared by dissolving 12 parts of a polyurethane-based thermosetting adhesive agent (Takelac A-310, a product by Takeda Pharmaceutical Co., Japan) and 1 part of an isocyanate curing agent (Takenate A-3, a product by the same company) in 520 parts of ethyl acetate followed by heating at 60° C. It was found that the overcoating solution thus applied could wet the surface of the organopolysiloxane layer only in the areas where the organopolysiloxane surface had been subjected to the plasma treatment without protection by the resist layer while the organopolysiloxane surface in the areas not subjected to the plasma treatment was repellent to the overcoating solution. The plate thus provided with the pattern-wise overcoating was then heated at 100° C. to effect complete curing of the overcoating resin forming the ink-receptive image areas of the printing plate. The surface level of this overcoating layer was about 5 μm higher than the fresh and bare surface of the organopolysiloxane layer in the ink-repellent non-image areas so that the ink-receptivity of the printing plate was remarkably improved to exhibit excellent printing durability giving about 200,000 sheets of sharp and satisfactory printed materials in the offset printing test.

What is claimed is:

1. A method for the preparation of a planographic printing plate which comprises the steps of:
    (a) providing a layer of an organopolysiloxane on one surface of a base plate,
    (b) providing a pattern-wise protective resist layer on the surface of the organopolysiloxane layer,
    (c) subjecting at least the superficial layer of the organopolysiloxane in the areas where no protective resist layer is provided thereon to a chemical treatment with chemical species activated in a plasma state to render the superficial layer oleophilic and ink-receptive, and
    (d) removing the protective resist layer.

2. The method as claimed in claim 1 wherein the organopolysiloxane layer provided on one surface of the base plate contains a filler.

3. The method as claimed in claim 1 wherein the pattern-wise protective resist layer is formed with a photosensitive material.

4. The method as claimed in claim 3 wherein the photosensitive material is a photocurable organopolysiloxane composition.

5. The method as claimed in claim 4 wherein the photocurable organopolysiloxane composition is a liquid having a surface tension in the range from 18 to 25 dynes/cm at 20° C.

6. The method as claimed in claim 3 wherein said photosensitive material comprises an organopolysiloxane in an amount from 1 to 15% by weight.

7. The method as claimed in claim 6 wherein the organopolysiloxane is a photocurable organopolysiloxane.

8. The method as claimed in claim 1 wherein the pattern-wise protective resist layer is formed with a non-photosensitive material.

9. The method as claimed in claim 1 wherein the pattern-wise protective resist layer contains a plasma-resistant inorganic filler.

10. The method as claimed in claim 1 wherein the organopolysiloxane layer provided on one surface of the base plate contains a metachromatic substance susceptible to the chemical treatment with the chemical species activated in a plasma state.

11. The method as claimed in claim 1 wherein the base plate is provided on one surface thereof with a layer of a metachromatic substance susceptible to the chemical treatment with the chemical species activated in a plasma state as an undercoating layer of the organopolysiloxane layer.

12. A method for the preparation of a planographic printing plate which comprises the steps of:
    (a) providing a layer of an organopolysiloxane on one surface of a base plate,
    (b) providing a pattern-wise protective resist layer on the surface of the organopolysiloxane layer,
    (c) subjecting at least the superficial layer of the organopolysiloxane in the areas where no protective resist layer is provided thereon to a chemical treatment with chemical species activated in a plasma state to render the superficial layer oleophilic and ink-receptive,
    (d) removing the protective resist layer, and
    (e) providing a layer of an abrasion-resistant ink-receptive material firmly bonded on to the surface of the organopolysiloxane layer in the areas where at least the superficial layer of the organopolysiloxane has been subjected to the chemical treatment with the chemical species activated in a plasma state.

13. A method for the preparation of a planographic printing plate which comprises the steps of:
    (a) providing a layer of an organopolysiloxane on one surface of a base plate,
    (b) providing a pattern-wise protective resist layer on the surface of the organopolysiloxane layer,
    (c) subjecting at least the superficial layer of the organopolysiloxane in the areas where no protective resist layer is provided thereon to a chemical treatment with chemical species activated in a plasma state to render the superficial layer oleophilic and ink-receptive, (d) providing a layer of an abrasion-resistant ink-receptive material on both of the pattern-wise protective resist layer and the organopolysiloxane layer having been subjected to the chemical treatment with the chemical species activated in a plasma state, and (e) removing the layer of the protective resist layer together with the layer of the abrasion-resistant ink-receptive material formed thereon.

* * * * *